United States Patent
Oike et al.

(10) Patent No.: US 11,229,150 B2
(45) Date of Patent: Jan. 18, 2022

(54) COMPONENT MOUNTING SYSTEM

(71) Applicant: FUJI CORPORATION, Chiryu (JP)

(72) Inventors: Hiroshi Oike, Chiryu (JP); Kenji Sugiyama, Anjo (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 562 days.

(21) Appl. No.: 16/305,516

(22) PCT Filed: Jun. 13, 2016

(86) PCT No.: PCT/JP2016/067545
§ 371 (c)(1),
(2) Date: Nov. 29, 2018

(87) PCT Pub. No.: WO2017/216846
PCT Pub. Date: Dec. 21, 2017

(65) Prior Publication Data
US 2021/0176907 A1  Jun. 10, 2021

(51) Int. Cl.
*H05K 13/08* (2006.01)
*G06T 1/00* (2006.01)
(Continued)

(52) U.S. Cl.
CPC ....... *H05K 13/0882* (2018.08); *G05B 19/406* (2013.01); *G06T 1/0007* (2013.01); *G06T 1/60* (2013.01); *H05K 13/0813* (2018.08)

(58) Field of Classification Search
CPC .......... H05K 13/0882; H05K 13/0813; G05B 19/406; G06T 1/0007; G06T 1/60
See application file for complete search history.

(56) References Cited

U.S. PATENT DOCUMENTS 10,667,446 B2 * 5/2020 Murano .......... G05B 19/41875
2015/0107088 A1 4/2015 Sagara et al.
(Continued)

FOREIGN PATENT DOCUMENTS

EP  3 154 327 A1  4/2017
JP  2698258 B2  1/1998
(Continued)

OTHER PUBLICATIONS

International Search Report dated Jul. 12, 2016 in PCT/JP2016/067545 filed Jun. 13, 2016.
(Continued)

*Primary Examiner* — Abderrahim Merouan
(74) *Attorney, Agent, or Firm* — Oblon, McClelland, Maier & Neustadt, L.L.P.

(57) ABSTRACT

Component mounting system 1 includes electronic component mounting device 10, control device 100, image processing device 110, and storage device 115. Electronic component mounting device 10 includes mounting head 26, supply device 28, and component camera 90. Electronic component mounting device 10 holds a supplied electronic component with mounting head 26, and images the held electronic component with component camera 90. Controller 102 performs image processing on captured image data with image processing device 110 to determine the acceptability and position of the electronic component (S6). Controller 102 monitors the start and end of the storage period (S10, S13) based on the magnitude relationship between the error rate calculated from the determination result information in the error rate calculation process (S8) and the reference error rate (S9). If the image data captured with component camera 90 is stored within the storage period, controller 102 stores the image data in storage device 115 (S11).

4 Claims, 4 Drawing Sheets

(51) Int. Cl.
*G05B 19/406* (2006.01)
*G06T 1/60* (2006.01)

(56) References Cited

U.S. PATENT DOCUMENTS

| | | | |
|---|---|---|---|
| 2020/0012264 A1* | 1/2020 | Kobayashi | G05B 19/418 |
| 2020/0100410 A1* | 3/2020 | Ushii | H05K 13/086 |
| 2020/0221617 A1* | 7/2020 | Tanizawa | H05K 13/0812 |
| 2021/0176907 A1* | 6/2021 | Oike | G05B 19/406 |

FOREIGN PATENT DOCUMENTS

| | | | | |
|---|---|---|---|---|
| JP | 11-145685 A | 5/1999 | | |
| JP | 2006-100332 A | 4/2006 | | |
| JP | 4504918 B2 | 7/2010 | | |
| JP | 2015-230912 A | 12/2015 | | |
| WO | WO 2004/075617 A1 | 9/2004 | | |
| WO | WO-2004075617 A1 * | 9/2004 | | H05K 13/083 |
| WO | WO 2014/128884 A1 | 8/2014 | | |

OTHER PUBLICATIONS

Extended European Search Report dated Dec. 5, 2019 in European Patent Application No. 16905401.2 citing documents AA, AO and AP therein, 7 pages.

* cited by examiner

COMPONENT MOUNTING SYSTEM

TECHNICAL FIELD

The present application relates to a component mounting system for mounting a component picked up by a pickup nozzle on a board, and more particularly, to a component mounting system capable of determining acceptability of the position of the component and the like using an image.

BACKGROUND ART

Conventionally, as an apparatus for producing a board on which a large number of components are mounted, a board production line is widely known such as a production line configured by a screen printing device, a component mounting device, a reflow machine, and the like, which are connected by a conveyance device. A component mounting device or the like of the board production line is configured such that a component is picked up with a pickup nozzle, and the component is mounted at a specified position on a board.

In order to mount a component at a specified position on a board with high accuracy, a component mounting system including the component mounting device performs image processing on image data obtained by capturing an image of the component picked up by the pickup nozzle, and whether the component is acceptable and the component position are determined. Since the image data captured in this way can be used as critical information for optimizing the mounting work and a work process including the mounting work, the image data is stored in a storage device or the like.

Patent literature 1 is directed toward such technology. A component mounting device described in patent literature 1 is configured so that a chip component picked up by a suction nozzle is mounted on a printed circuit board and performs recognition processing such as position recognition on an image captured by a component recognition camera. The component mounting device is configured to store, in error image RAM, an image in which a component recognition error occurs when there is a component recognition error with respect to an image captured by the component recognition camera during the component mounting work.

PRIOR ART LITERATURE

Patent literature 1: Japanese Patent No. 2698258

BRIEF SUMMARY

Technical Problem

In a component mounting system having such a configuration, image data captured by the camera and stored in the storage device can be used as an aid to investigating the cause of errors when the image processing and the mounting work in the component mounting device are being optimized, and further, the image data can be used to obtain the state at the time of the mounting work when an error occurs in a process after the component has been mounted on the board. The captured image data is very useful because it can be used for various purposes such as image processing and optimization of mounting work, but it is desirable to store the captured image data more rationally because the storage capacity of the storage device, the transmission speed of the data, and the like are limited.

In the case of the component mounting device described in patent literature 1, when there is a component recognition error in an image captured by the component recognition camera during the component mounting work, only images which are the source of a recognition error are stored in the storage device, which is more rational than storing all images captured regardless of whether there is a recognition error, but there is still room for improvement.

Further, in such a component mounting system, in order to produce a board while mounting components at specified positions on the board with high accuracy, it is important to maintain control of image processing and the mounting work in an appropriate state. For this reason, it is desirable to perform image processing on various images to confirm robustness of the content of the image processing or the like, and it is desirable to store a certain number of images.

The present disclosure takes account of such circumstances and an object thereof is to provide a component mounting system, for mounting on a board a component picked up by a pickup nozzle, which is capable of storing a sufficient amount of image data to adequately maintain the content of image processing or the like while reducing the burden on storage capacity or the like.

Solution to Problem

A component mounting system related to technology disclosed in the present application that takes account of the above-described circumstances, includes: a component supply section configured to supply a component to be mounted at a predetermined position of a board; a pickup nozzle configured to pick up the component supplied by the component supply section; an imaging section configured to capture an image of the component picked up by the pickup nozzle and acquire image data; a memory section configured to store image data captured by the imaging section; an image processing execution section configured to perform image processing on the image data captured by the imaging section; a determining section configured to determine acceptability of the component and a position of the component based on the image data subjected to the image processing by the image processing execution section; an error rate calculating section configured to calculate an error rate that is a ratio of determination results indicating an unacceptable result among a predetermined number of determination results from determination results obtained by the determining section for a predetermined number of images; a storage period monitoring section configured to start a storage period, during which the image data is stored in the memory section, when the error rate calculated by the error rate calculating section is larger than a predetermined reference error rate, and to end the storage period when the error rate calculated by the error rate calculating section is less than or equal to the reference error rate, and a storage control section configured to store the image data captured by the imaging section in the memory section during the storage period.

According to technology disclosed in the present application, since the image processing device includes a component supply section, a pickup nozzle, an imaging section, a memory section, an image processing execution section, and a determining section, it is possible to capture an image of a component picked up by the pickup nozzle, and perform image processing on the image data related to the process content data, so that acceptability of the component and a position of the component can be determined. Since the image processing device further includes an error rate calculating section, a storage period monitoring section, and a storage control section, it is possible to monitor the start and end of the storage period based on the magnitude relationship between the reference error rate and the error rate, being calculated from the determination results of the determining section with respect to a predetermined number of images, so that the images captured by the imaging section can be stored in the memory section during the storage period. By monitoring the start and end of the storage period using the storage period monitoring section, the number of images stored in the memory section can be limited and efficiently stored. Therefore, it is possible to retain a sufficient number of images for adjusting the process content of image processing or the like while reducing the burden on storage capacity of the memory section.

DESCRIPTION OF EMBODIMENTS

Figure 1:
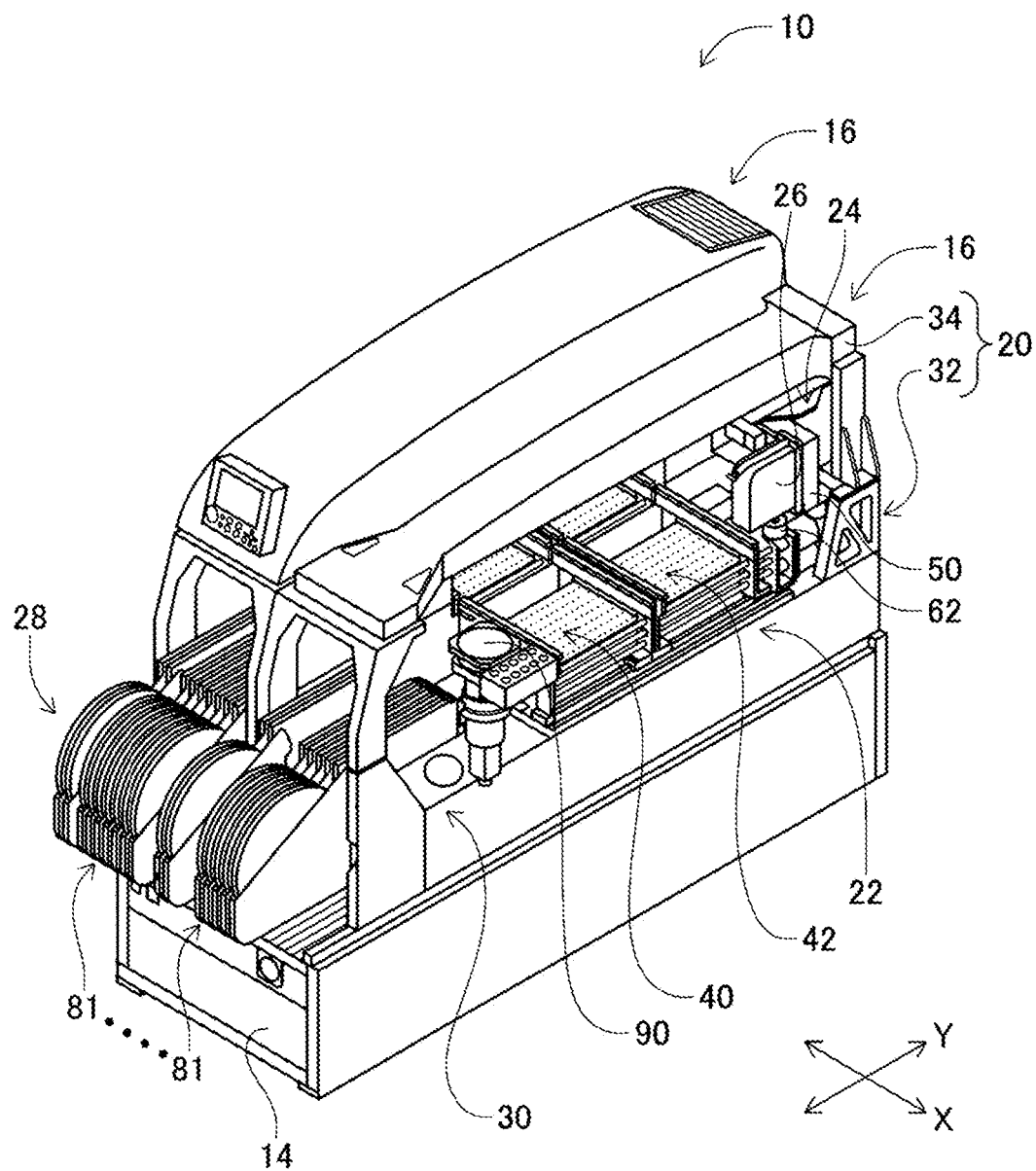
FIG. 1 is a perspective view of a component mounting device according to the present embodiment.

Hereinafter, an embodiment of the present disclosure consisting of component mounting system 1 having electronic component mounting device 10 will be described with reference to the drawings. FIG. 1 is a perspective view of electronic component mounting device 10 according to the present embodiment.

Configuration of the Electronic Component Mounting Device Electronic component mounting device 10 according to the present embodiment is a device for mounting an electronic component on a circuit board. Electronic component mounting device 10 has one system base 14 and two mounting machines 16 arranged side by side on system base 14. In the following description, the direction in which mounting devices 16 are arranged side by side is referred to as the X-axis direction, and the horizontal direction perpendicular to the X-axis direction is referred to as the Y-axis direction.

Each mounting machine 16 mainly includes mounting machine main body 20, conveyance device 22, mounting head moving device 24 (hereinafter, referred to as "moving device 24"), mounting head 26, supply device 28, component camera 90, and the like. Mounting machine main body 20 is composed of frame section 32 and beam section 34 mounted on frame section 32.

Conveyance device 22 comprises two conveyor devices, conveyor device 40 and conveyor device 42. Conveyor device 40 and conveyor device 42 are disposed in frame section 32 so as to extend in the X-axis direction in parallel with each other. Conveyor device 40 and conveyor device 42 each support circuit boards and convey the circuit boards, by way of electromagnetic motor 46 (see FIG. 2), in the X-axis direction. Further, the circuit boards are securely held in a predetermined position by board holding device 48 (see FIG. 2).

Moving device 24 is an XY-robot moving device and includes electromagnetic motor 52 (see FIG. 2) for sliding slider 50 in the X-axis direction and electromagnetic motor 54 (see FIG. 2) for sliding slider 50 in the Y-axis direction. Mounting head 26 is attached to slider 50, and mounting head 26 is moved to any position on frame section 32 by operation of electromagnetic motor 52 and electromagnetic motor 54.

Mounting head 26 mounts an electronic component to a circuit board. Mounting head 26 has suction nozzle 62 provided on a lower end surface thereof. Suction nozzle 62 communicates with positive and negative pressure supply device 66 (see FIG. 2) via a negative pressure air passage and a positive pressure air passage. Suction nozzle 62 picks up and holds the electronic component by negative pressure, and releases the held electronic component by positive pressure. Mounting head 26 has nozzle lifting and lowering device 65 (see FIG. 2) for lifting and lowering suction nozzle 62. Mounting head 26 changes the position of the held electronic component in up-down direction by nozzle lifting and lowering device 65.

Supply device 28 is a feeder-type supply device which is disposed at one end of frame section 32 in the Y-axis direction. Supply device 28 has tape feeder 81. Tape feeder 81 accommodates a taped component formed by taping electronic components in a wound state. Tape feeder 81 then feeds the taped components by feed device 82 (see FIG. 2). As a result, feeder-type supply device 28 feeds electronic components to a supply position by feeding the taped components. Tape feeder 81 is detachable from frame section 32 to support replacement of electronic components or the like. Also, tape feeder 81 can add electronic components and the like by splicing the taped components.

Figure 2:
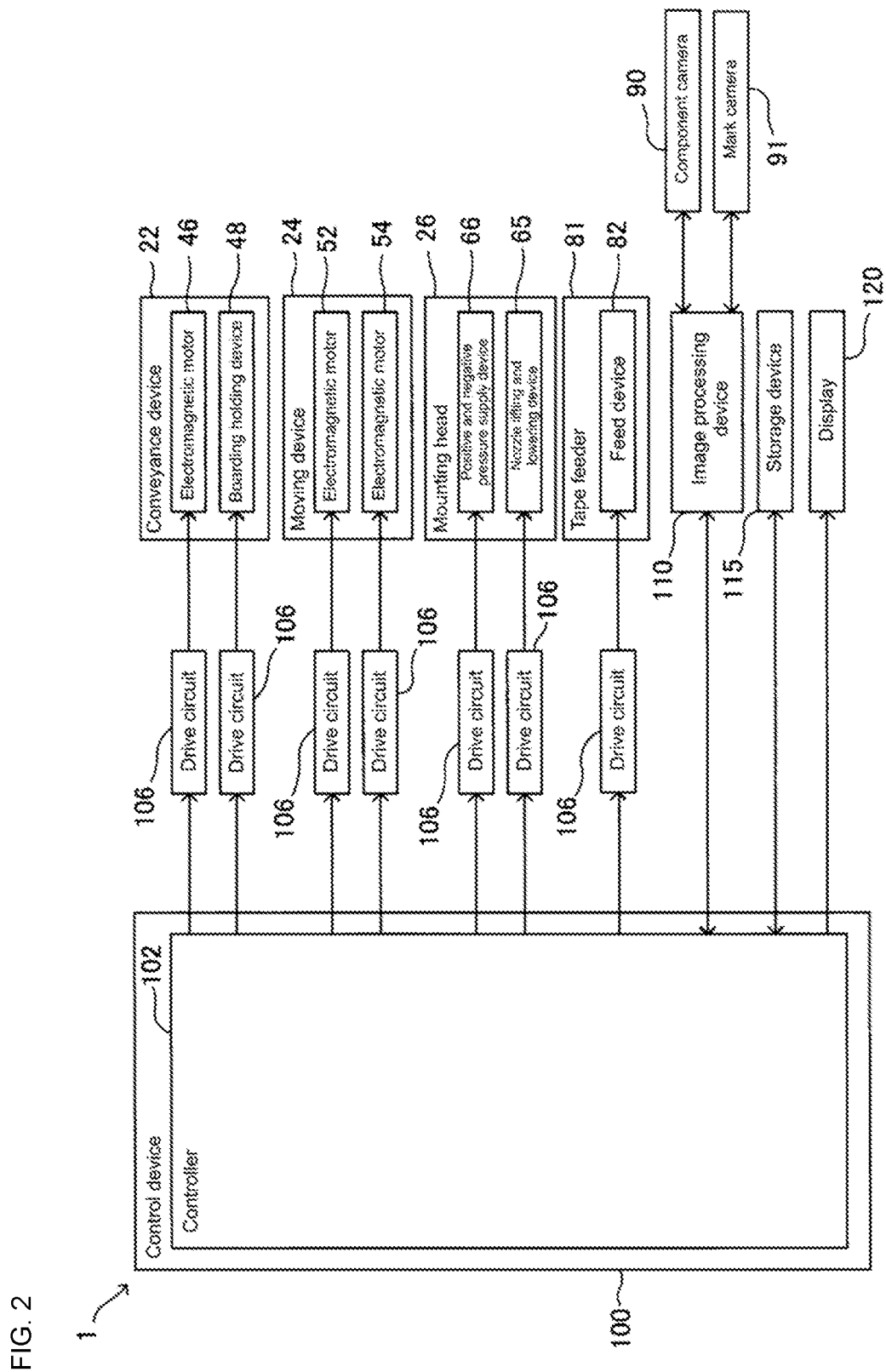
FIG. 2 is a block diagram showing a control system of a component mounting system according to the present embodiment.

Mounting machine 16 also includes component camera 90 and mark camera 91 (see FIG. 2). As shown in FIG. 1, component camera 90 is disposed between conveyance device 22 and supply device 28 on frame section 32 in an upward facing state. As a result, component camera 90 can capture an image of the part that is picked up and held by suction nozzle 62 of mounting head 26. Mark camera 91 is attached to slider 50 in a downward facing state, and is moved together with mounting head 26 in the X direction, the Y direction, and the Z direction. As a result, mark camera 91 can capture an image of any position on frame section 32.

As shown in FIG. 2, mounting machine 16 includes control device 100. Control device 100 includes controller 102 mainly composed of a computer having a CPU, ROM, RAM, and the like. Controller 102 is connected to multiple drive circuits 106, and the multiple drive circuits 106 are connected to electromagnetic motor 46, electromagnetic motor 52, electromagnetic motor 54, board holding device 48, nozzle lifting and lowering device 65, positive and negative pressure supply device 66, and feed device 82. As a result, operation of conveyance device 22, moving device 24, and the like are controlled by controller 102.

Controller 102 is connected to image processing device 110, storage device 115, and display 120. Image processing device 110 performs image processing on the image data obtained by component camera 90 and mark camera 91, and controller 102 acquires various types of information from the image data. Display 120 is a display device capable of displaying various types of information, and displays various types of information relating to component mounting system 1, such as an operating state of component mounting system 1, occurrence of an error, and the like based on a control signal from controller 102. Display 120 may display a reference error rate setting screen (see FIG. 4) based on a control signal from controller 102.

Storage device 115 is a storage device configured by an HDD or the like, and stores various pieces of information necessary for performing the mounting work, such as image data obtained by component camera 90 and mark camera 91 in a predetermined situation, and process content data representing the contents of image processing on an image captured by component camera 90. In this way, controller 102 obtains information necessary for the mounting work from storage device 115. Further, controller 102 may acquire information necessary for image processing in image processing device 110 (e.g., process content data) from storage device 115 and input the information to image processing device 110.

Here, the process content data represents the content of image processing performed on image data obtained from the electronic component images, and determination references and the like when determining acceptability of the component or the position of the component with respect to mounting head 26, and the process content data is associated with each type of component such as a connector, a chip, and an IC. Specifically, the process content data includes component shape data, algorithm pattern data, tolerance value data, coarse positioning template (i.e., seek line) data, and the like for each component type.

The component shape data is data indicating the external shape of a component and is used as a reference when determining acceptability of a component and the position of the component with respect to mounting head 26. The algorithm pattern data defines the combination and order of image processing algorithms that are performed before processing to determine the acceptability of a component and the position of the component with respect to mounting head 26. Since the optimum combination and order of image processing algorithms differ depending on the color tone, contrast, and the like of the components in the image data, multiple algorithm patterns are defined for each component type.

Further, storage device 115 stores information representing a reference error rate used in an image storage process program (see FIG. 3) to be described later. The reference error rate is set for each type or model number of a component and refers to the ratio of image processing errors (i.e., the determination result indicates an unacceptable result) among a predetermined number of determination results that determine acceptability of the component and the component position for a predetermined number of images. The reference error rate is referred to when monitoring the start and end of a storage period in an image storage process program.

Mounting Work by Mounting Machine

The above-described configuration of mounting machine 16 allows mounting head 26 to mount electronic components onto a circuit board held by conveyance device 22. More specifically, controller 102 executes a predetermined control program to conduct a pickup operation of an electronic component, a determination related to the picked up component, and a mounting work of the electronic component to a circuit board in component mounting system 1.

Under an instruction from controller 102, the circuit board is conveyed to a working position, and is securely held in that position by board holding device 48. Also, tape feeder 81 feeds out the taped component in response to an instruction from controller 102, and supplies the electronic component to the supply position. Mounting head 26 then is moved above the electronic component supply position by an instruction from controller 102, and the electronic component is picked up and held by suction nozzle 62.

Subsequently, mounting head 26 is moved to a predetermined position above component camera 90 by an instruction from controller 102. Component camera 90 captures an image of the electronic component picked up and held by mounting head 26 in response to an instruction from controller 102. In response to an instruction from controller 102, the captured image data is stored in storage device 115 in accordance with an image storage process program (see FIG. 3) to be described later. Image processing device 110 performs image processing based on the process content data on the image data in response to an instruction from controller 102. Controller 102 determines acceptability of and the position and orientation of the electronic component held by mounting head 26 based on image data subjected to image processing by image processing device 110.

Thereafter, mounting head 26 moves from above component camera 90 to above the circuit board held by board holding device 48 in response to an instruction from controller 102, and mounts the electronic component having an acceptable determination result to a predetermined position on the circuit board. In response to an instruction from controller 102, mounting head 26 discards electronic components that are unacceptable based on the determination result.

Content of Image Storage Process Program

Next, process contents of the image storage process program for controller 102 will be described with reference to FIGS. 3 and 4.

Figure 3:
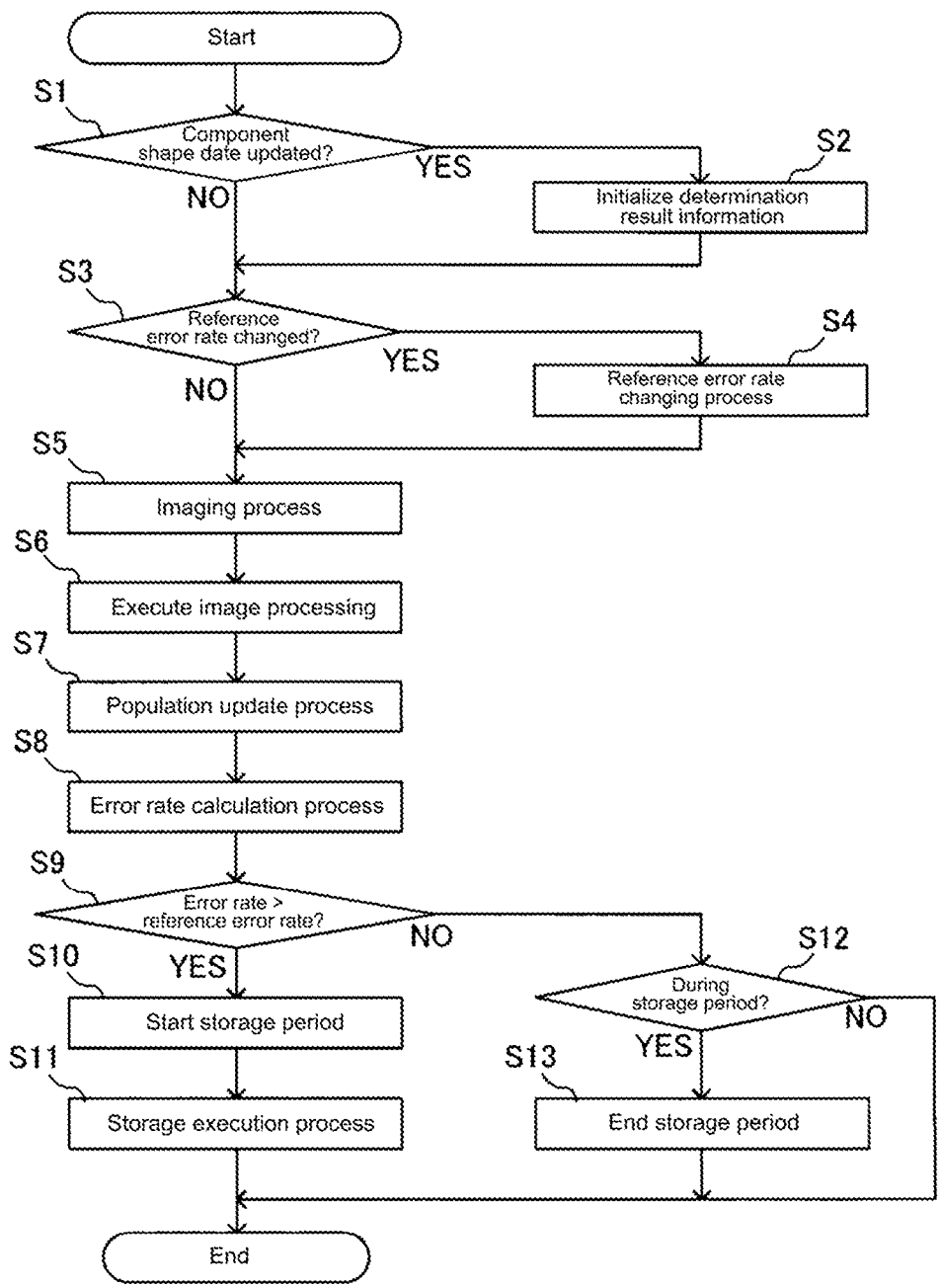
FIG. 3 is a flowchart of an image storage process program according to the present embodiment.
Figure 4:
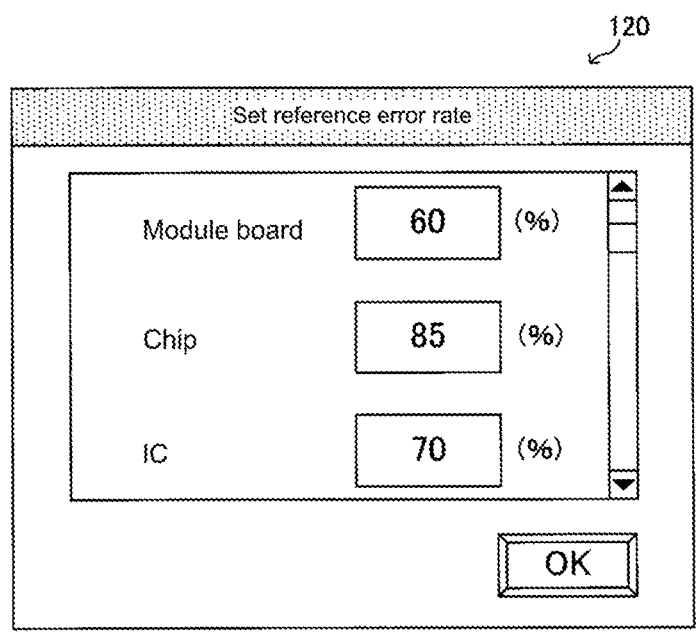
FIG. 4 is an example of a display of a reference error rate setting screen according to the present embodiment.

As shown in FIG. 3, in step 1 (hereinafter, 'step' will simply be written as 'S'), controller 102 determines whether the component shape data constituting the process content data stored in storage device 115 has been updated. In the present embodiment, controller 102 can update the component shape data by overwriting the component shape data stored in storage device 115 with new component shape data (which may be produced outside component mounting system 1 or edited in control device 100). If the component shape data has been updated (S1: YES), controller 102 proceeds to S2. On the other hand, if the component shape data has not been updated (S1: NO), controller 102 proceeds to S3.

Within the determination result information stored in the RAM of controller 102, in S2, controller 102 initializes the determination result information of the component related to the updated component shape data. The determination result information is information representing the history of determination results relating to the acceptability and position of the component in S6, which will be described later, and is stored for each type or model number of the component. The determination result information is composed of a history of determination results relating to the acceptability and position of the component, and is composed of determination results up to a predetermined quantity (e.g., 20 times). After initializing the determination result information of the corresponding component, controller 102 proceeds to S3.

In S3, controller 102 determines whether to change the reference error rate based on the control signal inputted to controller 102 from the operation section. When the reference error rate is changed (S3: YES), controller 102 proceeds to S4. On the other hand, if the reference error rate is not changed (S3: NO), the controller 102 proceeds to S5.

In S4, controller 102 executes a reference error rate changing process. Specifically, controller 102 outputs a control signal to display 120 on which a reference error rate setting screen is displayed. As shown in FIG. 4, the reference error rate setting screen is configured by associating input fields with each of multiple component types. The reference error rate currently set for each component is displayed in each input field. In component mounting system 1 according to the present embodiment, the user changes the reference error rate by inputting a numerical value of a desired reference error rate into an input field for a target component.

That is, according to component mounting system 1 of the present embodiment, by executing the reference error rate changing process (S4), it is possible to set different reference error rates for each component. For example, image data can be collected efficiently by setting the reference error rate to a low value for an electronic component having a complicated shape while setting the reference error rate to a high value for an electronic component having a simple shape. After completing the reference error rate changing process (S4), controller 102 proceeds to S5.

In the present embodiment, at the time of proceeding to S5, the pickup of the component by mounting head 26 is completed. Specifically, controller 102 first outputs a control signal to tape feeder 81 of supply device 28, thereby feeding out the taped component and supplying the electronic component to the supply position. Further, controller 102 outputs control signals to moving device 24 and mounting head 26 to move mounting head 26 to a position above the supply position of the electronic component, and causes suction nozzle 62 to pick up and hold the electronic component.

In S5, controller 102 executes an imaging process. Specifically, controller 102 first outputs control signals to moving device 24 and mounting head 26 to move mounting head 26 with holding the electronic component above component camera 90. Subsequently, controller 102 controls component camera 90 to capture, via image processing device 110, an image of the electronic component held by mounting head 26.

In S6, controller 102 executes image processing based on process content data, determines the acceptability and position of the component, and stores the determination result in the RAM of controller 102 as determination result information. Specifically, controller 102 obtains process content data relating to the electronic component from storage device 115, and outputs a control instruction to image processing device 110. Image processing device 110 performs image processing on the image data based on the process content data.

Then, image processing device 110 performs, for example, correction of the deviation amount between suction nozzle 62 and the center of the component, confirmation of conditions of rotation or inclination of the component with respect to suction nozzle 62, and confirmation of the outer shape of the picked up component. Thus, when the component pickup state of the suction nozzle 62 is abnormal or when the component shape itself is abnormal, it is determined that an image processing error has occurred, and when the component pickup state of the suction nozzle 62 is normal and there is no problem in the component shape itself, it is determined that the component pickup state is acceptable. Thereafter, controller 102 proceeds to S7.

In S7, controller 102 executes a population update process, and updates the configuration of the determination result information stored in the RAM of controller 102. Specifically, when the determination result information at the present time is composed of determination results with a predetermined quantity (e.g., 20 times), controller 102 adds the determination result obtained at the preceding step S6 and deletes the oldest determination result from the determination result information. On the other hand, when the determination result information at the present time is composed of determination results fewer than the predetermined quantity (e.g., 20 times), controller 102 adds the determination result obtained at the preceding step S6. As a result, the determination result information is configured by the determination result for the latest predetermined quantity, and is updated to indicate the latest state. Thereafter, controller 102 proceeds to S8.

In S8, controller 102 executes an error rate calculation process, and calculates an error rate at the present time based on the determination result information relating to the component. More specifically, when the determination result information at the present time is composed of the determination results of the predetermined quantity (e.g., 20 times), controller 102 calculates an error rate which is the percentage of the determination results with image processing errors to all the determination results up to the predetermined number iteration. When the determination result information at the present time is composed of the determination results fewer than the predetermined quantity (e.g., 20 times), controller 102 calculates the error rate by calculating the ratio of determination results with image processing errors with respect to all the determination results constituting the determination result information. After calculating the error rate based on the determination result information, controller 102 proceeds to S9.

In S9, controller 102 determines whether the error rate calculated in the error rate calculation process (S8) is larger than the reference error rate set for the component. When the calculated error rate is larger than the reference error rate (S9: YES), controller 102 proceeds to S10. On the other hand, when the calculated error rate is equal to or less than the reference error rate (S9: NO), controller 102 proceeds to S12.

In S10, controller 102 starts the storage period and simultaneously sets the storage period flag in the RAM of controller 102 to ON. The storage period flag is a flag indicating whether image data captured in the imaging process (S5) is within a storage period during which image data is stored in storage device 115. After starting the storage period and turning on the storage period flag, controller 102 proceeds to S11. If the process shifts to S10 in a state where the storage period has already started, controller 102 proceeds to S11 while continuing the storage period.

In S11, controller 102 executes a storage execution process, and stores the image data captured in the imaging process (S5) in storage device 115. That is, since the component image data captured by the component camera 90 is stored within a storage period, sufficient amount of image data for performing adjustment of the process content data can be stored under the limited storage capacity without handling a large amount of image data. After storing the image data in storage device 115, controller 102 ends the image storage process program.

When the calculated error rate is equal to or less than the reference error rate (S9: NO), in S12, controller 102 refers to the storage period flag in the RAM of controller 102 to determine whether the current material is within the storage period. If the current material is within the storage period (S12: YES), controller 102 proceeds to S13. On the other hand, if the current material is not within the storage period (S12: NO), controller 102 ends the image storage process program.

In S13, controller 102 sets the storage period flag in the RAM of controller 102 to OFF at the same time as ending the storage period. After the storage period is terminated and the storage period flag is turned off, controller 102 terminates the image storage process program.

As described above, component mounting system 1 according to the present embodiment includes electronic component mounting device 10, image processing device 110, storage device 115, and display 120. In electronic component mounting device 10, each mounting machine 16 includes conveyance device 22, moving device 24, mounting head 26, supply device 28, and component camera 90.

Mounting machine 16 holds the electronic component supplied by supply device 28 with mounting head 26, and images the held electronic component with component camera 90. Thereafter, mounting machine 16 holds and moves the electronic component by mounting head 26 to mount the electronic component to the circuit board conveyed to a predetermined position by conveyance device 22. Component mounting system 1 then performs image processing according to the process content data on the image data of the electronic component captured by component camera 90 by image processing device 110, and determines acceptability and the position of the electronic component with respect to mounting head 26 (S6).

Component mounting system 1 can monitor the start and end of the storage period (S10, S13) based on the magnitude relationship between the error rate, being calculated from the determination result information in the error rate calculation process (S8), and the reference error rate (S9), so as to store the image data captured with component camera 90 in storage device 115 when the image data is stored within the storage period (S11). That is, component mounting system 1 monitors the start and end of the storage period by the processes of S9 to S13, thereby limiting the number of images to be stored in storage device 115, which results in the image data being efficiently stored. Therefore, with the component mounting system 1, it is possible to secure a sufficient number of images to adjust the process content of image processing or the like while reducing the load on the storage capacity of storage device 115.

In component mounting system 1, the reference error rate changing process (S4) is executed, and the reference error rate setting screen (see FIG. 4) displayed on display 120 can be used to set the reference error rate for each type or model number of the electronic component mounted on the circuit board. Therefore, with component mounting system 1, since the reference error rate can be individually set for each type electronic component or the like, the start and end of the storage period can be controlled for each type of electronic component or the like so that an adequate number of images can be stored in storage device 115.

Further, in component mounting system 1, by executing the population update process (S7), it is possible to update the population (i.e., multiple determination results constituting the determination result information) relating to the calculation of the error rate in the error rate calculation process (S8) to the latest state. As a result, according to component mounting system 1, since the error rate is calculated from the population in the latest state in error rate calculation process (S8), it is possible to improve the determination accuracy related to the start and end of the storage period, and it is possible to store the image data in storage device 115 properly and efficiently.

In component mounting system 1, when the component shape data is updated (S1: YES), the determination result information of the electronic component related to the component shape data is initialized (S2). However, the determination result information determined in the state before the update may deviate from the current state, when the component shape data, being used for determining the acceptability and position of the component, is updated in S6. Therefore, by initializing the determination result information before updating, the error rate calculated on the basis of the determination result in the error rate calculation process (S8) can be matched with the current state. As a result, with component mounting system 1, it is possible to improve the determination accuracy related to the start and end of the storage period, and it is possible to store the image data in storage device 115 properly and efficiently.

Component mounting system 1 and electronic component mounting device 10 of the embodiment described above constitute an example of the component mounting system of the present disclosure, and supply device 28 and tape feeder 81 constitute an example of the component supply section of the present disclosure. Mounting head 26 and suction nozzle 62 constitute an example of a pickup nozzle in the present disclosure, and component camera 90 is an example of an imaging section in the present disclosure. Storage device 115 is an example of a storage section in the present disclosure, and image processing device 110 is an example of an image processing execution section in the present disclosure. Control device 100 and controller 102 constitute an example of a determining section, an error rate calculating section, a storage period monitoring section, and a storage control section in the present disclosure.

Although the present disclosure has been described based on the embodiment described above, the present disclosure is not limited to the embodiment described above, and various modifications and changes are possible within a scope that does not depart from the spirit of the present disclosure. For example, in the embodiment described above, the component mounting system 1 includes electronic component mounting device 10, control device 100, image processing device 110, storage device 115, and display 120, but the present disclosure is not limited to this embodiment.

For example, component mounting system 1 may be configured by electronic component mounting device 10 in case of incorporating control device 100, image processing device 110, storage device 115, and display 120 in one electronic component mounting device 10. Further, component mounting system 1 may be also configured by incorporating some parts of image processing device 110, storage device 115, and display 120 in electronic component mounting device 10, while connecting the remaining part to electronic component mounting device 10 via a network.

In the embodiment described above, component mounting system 1 is configured to include one each of electronic component mounting device 10, image processing device 110, and storage device 115, but component mounting system 1 is not limited to this. Component mounting system 1 may have a configuration in which multiple electronic component mounting devices 10 are connected to image processing device 110, storage device 115, and display 120.

In the embodiment described above, the reference error rate can be individually set and changed for each type of electronic component in the reference error rate changing process (S4), but the present disclosure is not limited to this. For example, it is also possible to set and change the maximum number of determination results (i.e., the size of the population when calculating the error rate) constituting the determination result information referred to in the error rate calculation process (S8) and for the reference error rate to be set and changed for each type of electronic component.

REFERENCE SIGNS LIST

1: component mounting system; 10: electronic component mounting device 16: mounting machine; 22: conveyance device; 24: moving device; 26: mounting head; 28: supply device; 62: suction nozzle; 81: tape feeder; 90: component camera; 100: control device; 102: controller; 110: image processing device; 115: storage device; 120: display

The invention claimed is:

1. A component mounting system, comprising:
a component supply section configured to supply a component to be mounted at a predetermined position of a board;
a pickup nozzle configured to pick up the component supplied by the component supply section;
an imaging section configured to capture an image of the component picked up by the pickup nozzle and acquire image data;
a memory section configured to store image data captured by the imaging section;
an image processing execution section configured to perform image processing on the image data captured by the imaging section;
a determining section configured to determine acceptability of the component and a position of the component based on the image data subjected to the image processing by the image processing execution section;
a population updating section configured to add a most recent determination result to a predetermined number of determination results from determination results obtained by the determining section for a predetermined number of images and to delete an oldest determination result from the predetermined number of determination results;
an error rate calculating section configured to calculate an error rate that is a ratio of determination results indicating an unacceptable result among the predetermined number of determination results;
a storage period monitoring section configured to start a storage period, during which the image data is stored in the memory section, when the error rate calculated by the error rate calculating section is larger than a predetermined reference error rate, and to end the storage period when the error rate calculated by the error rate calculating section is less than or equal to the reference error rate, and
a storage control section configured to store the image data captured by the imaging section in the memory section during the storage period.

2. The component mounting system according to claim 1, further comprising
a reference setting section capable of setting the reference error rate for each of multiple components mounted on the board.

3. The component mounting system according to claim 1, wherein
the population updating section updates the predetermined number of determination results used for calculating the error rate to a latest state after the image processing by the image processing execution section has been performed on the image data captured by the imaging section and the determination has been made by the determining section.

4. The component mounting system according to claim 1, wherein the error rate calculating section initializes the determination results of the determining section regarding the component when component shape data of the component used for the determination with the determining section is updated.

* * * * *